(12) United States Patent
Jiang et al.

(10) Patent No.: US 6,768,209 B1
(45) Date of Patent: Jul. 27, 2004

(54) UNDERFILL COMPOUNDS INCLUDING ELECTRICALLY CHARGED FILLER ELEMENTS, MICROELECTRONIC DEVICES HAVING UNDERFILL COMPOUNDS INCLUDING ELECTRICALLY CHARGED FILLER ELEMENTS, AND METHODS OF UNDERFILLING MICROELECTRONIC DEVICES

(75) Inventors: Tongbi Jiang, Boise, ID (US); Curtis Hollingshead, Boise, ID (US); Warren M. Farnworth, Nampa, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/357,587

(22) Filed: Feb. 3, 2003

(51) Int. Cl.[7] ............................................. H01L 29/40
(52) U.S. Cl. ..................................... 257/778; 257/737
(58) Field of Search ................................ 257/778, 737, 257/738, 787

(56) References Cited

U.S. PATENT DOCUMENTS

| | | | |
|---|---|---|---|
| 5,194,930 A | * | 3/1993 | Papathomas et al. ........ 257/773 |
| 5,760,337 A | * | 6/1998 | Iyer et al. ................... 174/52.2 |
| 5,866,953 A | | 2/1999 | Akram et al. |
| 5,891,753 A | | 4/1999 | Akram |
| 5,898,224 A | | 4/1999 | Akram |
| 6,310,288 B1 | | 10/2001 | Moden |
| 6,448,665 B1 | * | 9/2002 | Nakazawa et al. .......... 257/789 |

* cited by examiner

*Primary Examiner*—Roy Potter
(74) *Attorney, Agent, or Firm*—Perkins Coie LLP

(57) ABSTRACT

Underfill compounds including electrically charged filler elements, microelectronic devices having underfill compounds including electrically charged filler elements, and methods of disposing underfill including electrically charged filler elements on microelectronic devices are disclosed herein. In one embodiment, a microelectronic device includes a microelectronic component, a plurality of electrical couplers carried by the microelectronic component, and an underfill layer covering at least a portion of the electrical couplers. The underfill layer comprises a binder and a plurality of electrically charged filler elements in the binder. The underfill layer can include a first zone having a first concentration of electrically charged filler elements and a second zone having a second concentration of electrically charged filler elements different than the first concentration.

42 Claims, 5 Drawing Sheets

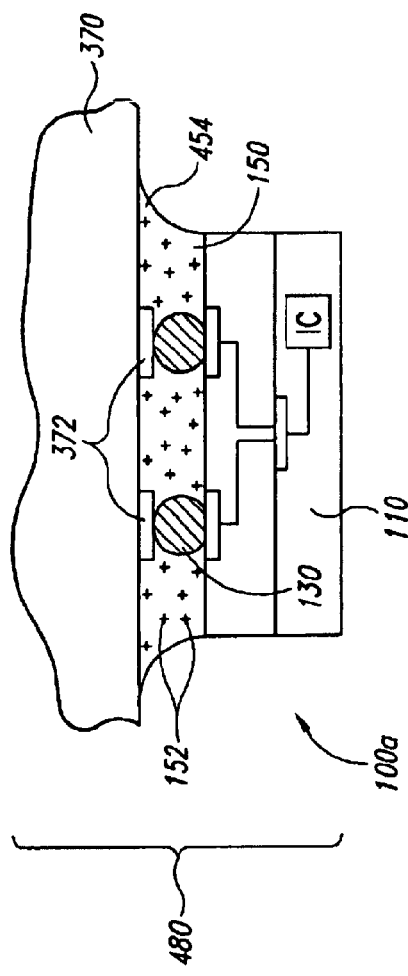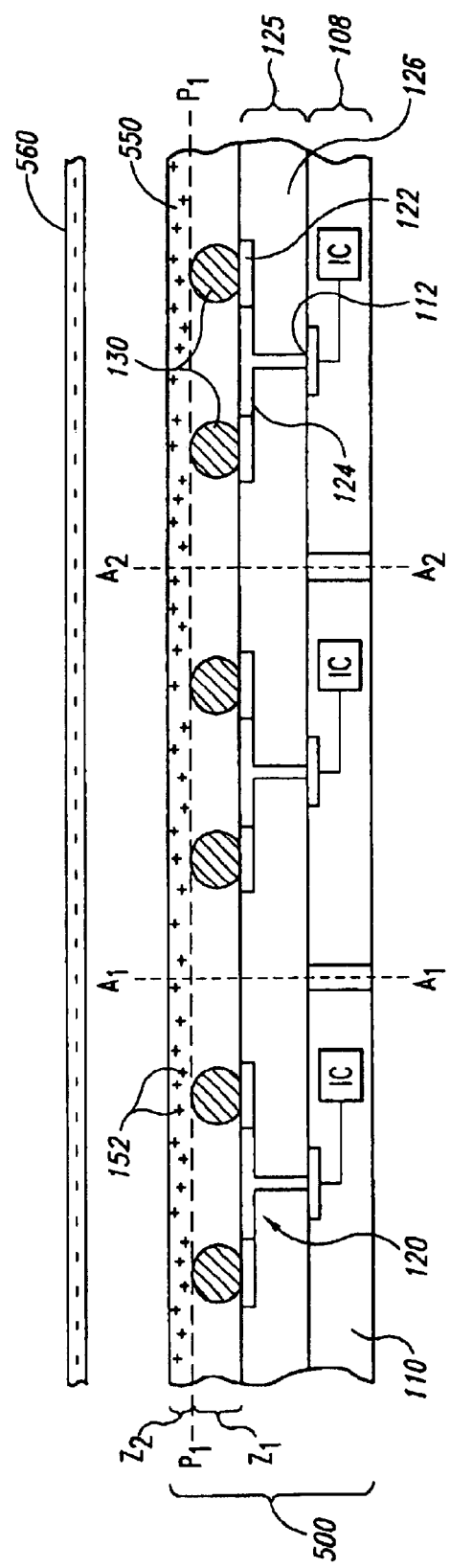

UNDERFILL COMPOUNDS INCLUDING ELECTRICALLY CHARGED FILLER ELEMENTS, MICROELECTRONIC DEVICES HAVING UNDERFILL COMPOUNDS INCLUDING ELECTRICALLY CHARGED FILLER ELEMENTS, AND METHODS OF UNDERFILLING MICROELECTRONIC DEVICES

TECHNICAL FIELD

The present invention relates to underfll compounds including electrically charged filler elements, microelectronic devices having underfill compounds including electrically charged filler elements, and methods of disposing underfill compounds having electrically charged filler elements on microelectronic devices.

BACKGROUND

Microelectronic device assemblies, such as memory devices and microprocessors, typically include one or more microelectronic components attached to a substrate, The microelectronic components commonly, include at least one die having functional features such as memory cells, integrated circuits, and interconnecting circuitry. The dies of the microelectronic components may be encased in a plastic, ceramic, or metal protective covering. Each die commonly includes an array of very small bond-pads electrically coupled to the functional features. The bond-pads can be used to operatively connect the microelectronic component to the substrate.

One type of microelectronic component is a "flip-chip" semiconductor device. These components are referred to as "flip-chips" because they are typically manufactured on a wafer and have an active side with bond-pads that initially face upward. After manufacture is completed and a die is singulated, the die is inverted or "flipped" such that the active side bearing the bond-pads faces downward for attachment to a substrate. The bond-pads are usually coupled to terminals, such as conductive "bumps," that electrically and mechanically connect the die to the substrate. The bumps on the flip-chip can be formed from solders, conductive polymers, or other materials. In applications using solder bumps, the solder bumps are reflowed to form a solder joint between the flip-chip component and the substrate. This leaves a small gap between the flip-chip and the substrate. To enhance the integrity of the joint between the microelectronic component and the substrate, an underfill material is introduced into the gap. The underfill material bears some of the stress placed on the components and protects the components from moisture, chemicals and other contaminants. The underfill material can include filler particles to increase the rigidity of the material and modify the coefficient of thermal expansion of the material.

The underfill material typically is dispensed into the underfill gap by depositing a bead of the underfill material along one or two sides of the flip-chip when the underfill material is in a fluidic state (i.e., flowable). As shown schematically in FIG. 1, a bead of an underfill material U may be dispensed along one side of the die D. The flowable underfill material will then be drawn into the gap between the die D and the substrate S by capillary action. The direction of this movement is indicated by the arrows in FIG. 1. After the underfill material fills the gap, it is cured to a hardened state. Although such a "single stroke" process yields good results, the processing time necessary to permit the underfill material U to flow across the entire width of the die can reduce the throughput of the manufacturing process.

FIG. 2 illustrates an alternative approach wherein the underfill material U is applied in an L-shaped bead along two adjacent sides of the die D. By reducing the average distance that the underfill material has to flow to fill the underfill gap, processing times can be reduced. The L-stroke approach, however, can lead to more voids in the underfill material, which adversely affect the integrity of the bond between the die D and the substrate S.

In the single stroke and L-stroke approaches, the filler particles can become segregated from the polymer fluid as the underfill material flows across the die. Consequently, one side of the flip-chip often has a greater concentration of filler particles. The nonuniform distribution of filler particles creates differences in the rigidity and the coefficient of thermal expansion of the underfill material across the die.

In other embodiments, the underfill material may be deposited across a plurality of dies at the wafer-level to form an underfill layer. After the underfill layer is formed, the dies can be singulated and attached to substrates. Forming an underfill layer with filler particles on a die before attaching a substrate to the die has some drawbacks. For example, the filler particles in the portion of the underfill layer above the conductive bumps can obstruct the connection between the conductive bumps of the die and the substrate. To prevent the filler particles from interfering with the connection, one approach is to form two underfill layers on the die. The first underfill layer includes filler particles and has a thickness no greater than the height of the conductive bumps. The second underfill layer is formed over the first layer and does not contain filler particles. This approach, however, requires two dispensers and two types of underfill material. Another approach is to form the underfill layer on the die at the wafer-level before forming the conductive bumps. Next, vias are formed in the underfill layer and the conductive bumps are formed in the vias. This approach, however, is complicated and can result in contamination of the underfill layer and/or the conductive bumps. Moreover, it is difficult to deposit solder paste in very small vias. Another approach is to form the underfill layer over the die and the conductive bumps, then remove the top portion of the underfill layer so that the underfill layer has a thickness equal to the height of the conductive bumps. This approach also is complicated, requires cleaning, and may contaminate the device. Accordingly, a new method for forming an underfill layer that has filler particles is needed.

SUMMARY OF THE INVENTION

The present invention is directed to underfill compounds including electrically charged filler elements, microelectronic devices having underfill compounds including electrically charged filler elements, and methods of disposing underfill compounds including electrically charged filler elements on microelectronic devices. One aspect of the invention is directed to a composition for use in an underfill layer of a microelectronic device. In one embodiment, the composition includes a flowable binder and a plurality of electrically charged filler elements disposed within the flowable binder. The electrically charged filler elements can include silica, silicon nitride, aluminum oxide, and/or aluminum nitride. The flowable binder can include a liquid polymer.

Another aspect of the invention is directed to a microelectronic device. In one embodiment, the microelectronic device includes a microelectronic component, a plurality of electrical couplers carried by the microelectronic component, and an underfill layer covering at least a portion of the plurality of electrical couplers. The underfill layer comprises a binder and a plurality of electrically charged filler elements in the binder. In one aspect of this embodiment, the underfill layer also includes a first zone having a first concentration of electrically charged filler elements and a second zone having a second concentration of electrically charged filler elements different from the first concentration. The first zone can include the portion of the underfill layer between the distal ends of the electrical couplers, and the second zone can include the portion of the underfill layer between the distal ends of the electrical couplers and a distal surface of the underfill layer. Alternatively, the underfill layer can include a first zone and a plurality of second zones. The second zones can be generally hemispherical and extend between the distal surface of the underfill layer and the distal ends of the electrical couplers.

Another aspect of the invention is directed to a method for disposing underfill material on a microelectronic device having a plurality of electrical couplers. In one embodiment, the method includes depositing an underfill layer onto the microelectronic device and covering at least a portion of the electrical couplers. The underfill layer includes a binder and a plurality of electrically charged filler elements in the binder. The method further includes applying an electric field to the underfill layer to manipulate at least a portion of the electrically charged filler elements. In one aspect of this embodiment, applying the electric field includes moving at least a portion of the electrically charged filler elements from a first zone into a second zone.

Another aspect of the invention is directed to a method of underfilling a microelectronic device assembly including a microelectronic component, a substrate, and a plurality of electrical couplers coupling the microelectronic component to the substrate. In one embodiment, the method includes disposing an underfill layer including a plurality of electrically charged filler elements between the microelectronic component and the substrate and moving at least a portion of the plurality of electrically charged filler elements within the underfill layer by applying an electric field to the underfill layer.

BRIEF DESCRIPTION OF THE DRAWINGS

FIGS. 3–6 illustrate various stages in a method of disposing an underfill material on a microelectronic device and attaching the device to a substrate.

FIG. 3 is a schematic side cross-sectional view of a microelectronic workpiece including a plurality of microelectronic devices after depositing an underfill layer.

FIG. 5 is a schematic side cross-sectional view of the microelectronic device of FIG. 4A after singulation.

FIG. 6 is a schematic side cross-sectional view of a microelectronic device assembly.

FIG. 7 is a schematic side cross-sectional view of a microelectronic workpiece having a plurality of microelectronic devices in accordance with another embodiment of the invention.

FIG. 8 is a schematic side cross-sectional view of a microelectronic device assembly including a microelectronic component and a substrate coupled to the microelectronic component.

FIG. 9 is a schematic side cross-sectional view of a microelectronic device assembly in accordance with another embodiment of the invention.

FIG. 10 is a schematic side cross-sectional view of a microelectronic device assembly in accordance with another embodiment of the invention.

DETAILED DESCRIPTION

The following description is directed toward microelectronic devices, microelectronic device assemblies, methods for disposing underfill material on microelectronic devices, and methods for underfilling microelectronic device assemblies. The term "microelectronic workpiece" is used throughout to include substrates upon which and/or in which microelectronic devices, micromechanical devices, data storage elements, and other features are fabricated. For example, microelectronic workpieces can be semiconductor wafers, glass substrates, insulative substrates, or many other types of substrates. Many specific details of several embodiments of the invention are described below with reference to a microelectronic device including a microelectronic die in order to provide a thorough understanding of such embodiments. Those of ordinary skill in the art will thus understand that the invention may have other embodiments with additional elements or without several of the elements described in this section.

FIGS. 3–6 illustrate various stages in a method of disposing an underfill material on a microelectronic device and attaching the device to a substrate. In the illustrated method, an underfill material is disposed on a plurality of microelectronic devices as part of a batch process. In other embodiments, the underfill material can be disposed on a single microelectronic device according to the illustrated method.

Figure 3:
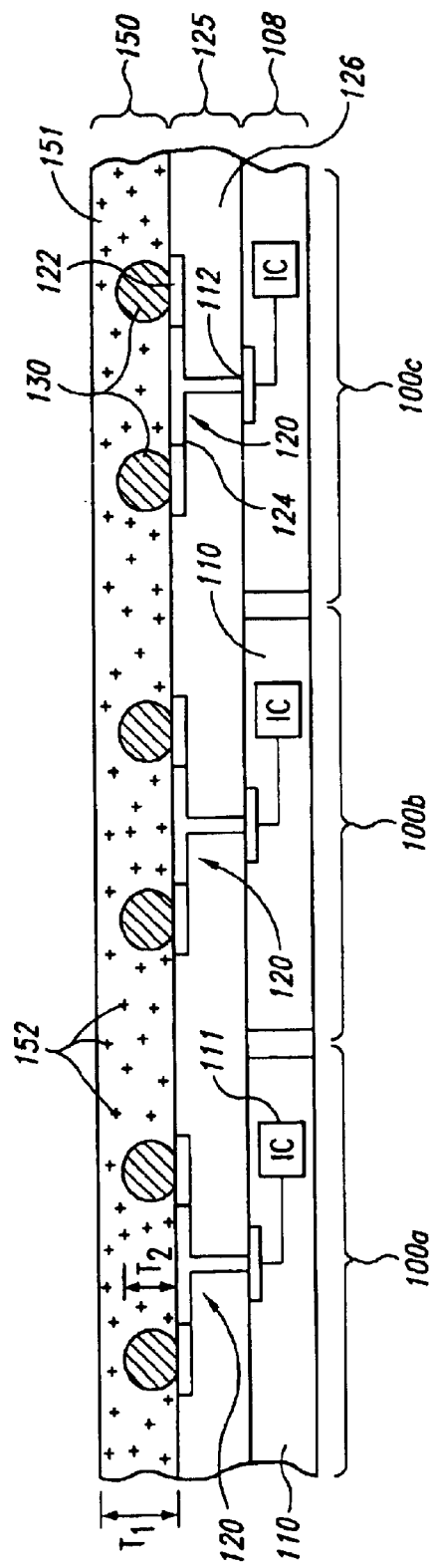

FIG. 3 is a schematic side cross-sectional view of a microelectronic workpiece including a plurality of microelectronic devices 100 (identified individually as 100a–c) after depositing an underfill layer 150 in accordance with one embodiment of the invention. The microelectronic devices 100 can be formed on a substrate 108, and each device 100 can include a microelectronic component such as a die 110 having an integrated circuit 111 (shown schematically) and a plurality of bond-pads 112 coupled to the integrated circuit 111. The microelectronic devices 100 can each include a redistribution assembly 120 with ball-pads 122 and traces 124 for coupling the, bond-pads 112 of a corresponding die 110 to a printed circuit board or other device. The ball-pads 122 are arranged in ball-pad arrays relative to the dies 110 such that each die 110 has a corresponding array of ball-pads 122. The redistribution assemblies 120 can be separate components of a redistribution layer 125 that include a dielectric stratum 126 separating the traces 124 and the ball-pads 122.

In the illustrated embodiment, the microelectronic devices 100 also include a plurality of electrical couplers 130, such as solder balls, formed on corresponding ball-pads 122 of the redistribution assembly 120. In other embodiments, the microelectronic devices may not include a redistribution assembly. In these embodiments, the electrical couplers can be formed directly on the bond-pads of the microelectronic dies or other types of electrical terminals coupled to the dies.

The microelectronic devices 100 of FIG. 3 include the underfill layer 150 to protect the devices 100 from moisture, chemicals and contaminants. In one aspect of the illustrated embodiment, the underfill layer 150 has a thickness $T_1$ greater than the height. $T_2$ of the electrical couplers 130. In other embodiments, the underfill layer 150 may not cover all of the electrical couplers 130. In another aspect of the illustrated embodiment, the underfill layer 150 includes a flowable matrix or binder 151 and a plurality of electrically charged filler elements 152 disposed within the binder 151. The binder 151 can include an epoxy, a resin, or suitable material. The electrically charged filler elements 152 can be micelles including an organic substance and filler particles in the organic substance. The filler particles can be silica, silicon nitride, aluminum nitride, aluminum oxide, or other suitable materials. In the illustrated embodiment, the electrically charged filler elements 152 have a positive charge. In other embodiments, the electrically charged filler elements can have a negative charge. The electrically charged filler elements 152 increase the rigidity and modify the coefficient of thermal expansion of the underfill layer 150.

Figure 4A:
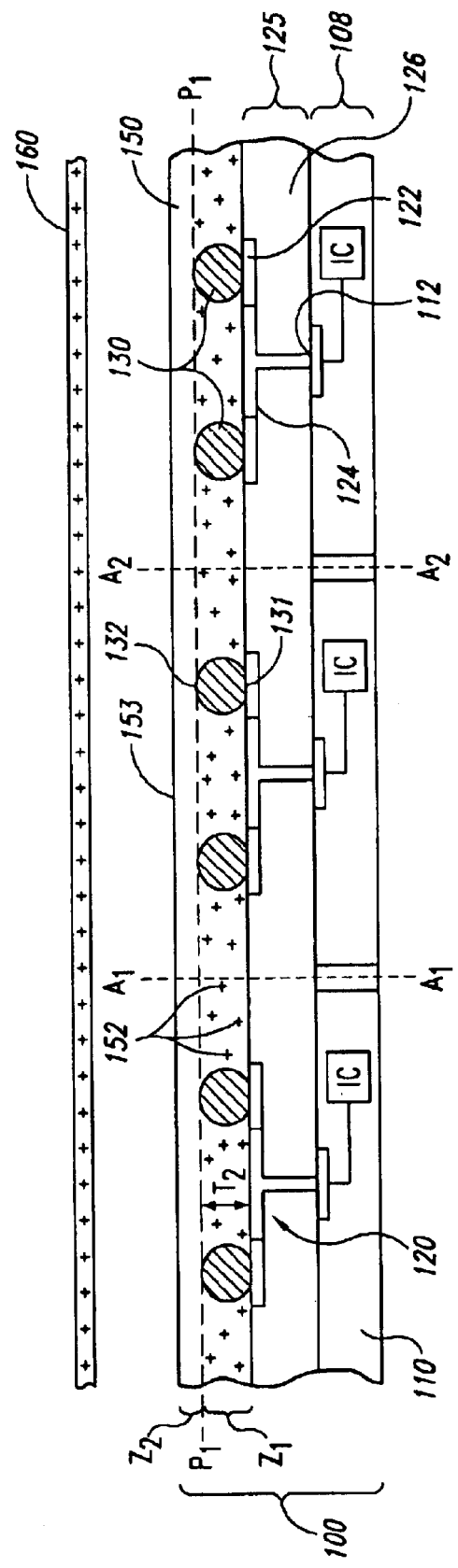
FIG. 4A is a schematic side cross-sectional view of the microelectronic devices after moving at least some of the electrically charged filler elements within the underfill layer.

FIG. 4A is a schematic side cross-sectional view of the microelectronic devices 100 after moving at least some of the electrically charged filler elements 152 within the underfill layer 150 while the binder 151 is in a flowable state. In the illustrated embodiment, each electrical coupler 130 has a proximal end 131 coupled to a corresponding ball-pad 122 and a distal end 132 opposite the proximal end 131. The distal ends 132 of the electrical couplers 130 define a plane $P_1$ that divides the underfill layer 150 into a first zone $Z_1$ and a second zone $Z_2$. The first zone $Z_1$ includes the portion of the underfill layer 150 between the plane $P_1$ and the redistribution layer 125, and the second zone $Z_2$ includes the portion of the underfill layer 150 between the plane $P_1$ and a surface 153 of the underfill layer 150.

In one aspect of the illustrated embodiment, an electric field source 160, such as a charged plate, selectively generates an electric field to move the electrically charged filler elements 152 within the underfill layer 150. For example, the electric field source 160 can repel the electrically charged filler elements 152 causing at least some of the elements 152 to move from the second zone $Z_2$ to the first zone $Z_1$. Accordingly, the concentration of electrically charged filler elements 152 in the second zone $Z_2$ is less than the concentration of electrically charged filler elements 152 in the first zone $Z_1$. Removing the electrically charged filler elements 152 from the second zone $Z_2$ of the underfill 150 allows the electrical couplers 130 to be properly and reliably connected to another device, such as a printed circuit board, as will be described in detail below.

After the electrically charged filler elements 152 have been moved to the first zone $Z_1$ of the underfill layer 150, the underfill layer 150 can be partially cured, such as to a "B" stage (partially linked), to prevent the elements 152 from migrating back into the second zone $Z_2$. The substrate 108 of the microelectronic devices 100 can also be back ground to reduce the profile of the devices 100. After curing, the substrate 108, redistribution layer 125, and the underfill layer 150 can be cut along lines $A_1$ and $A_2$ to singulate the microelectronic devices 100.

Figure 4B:
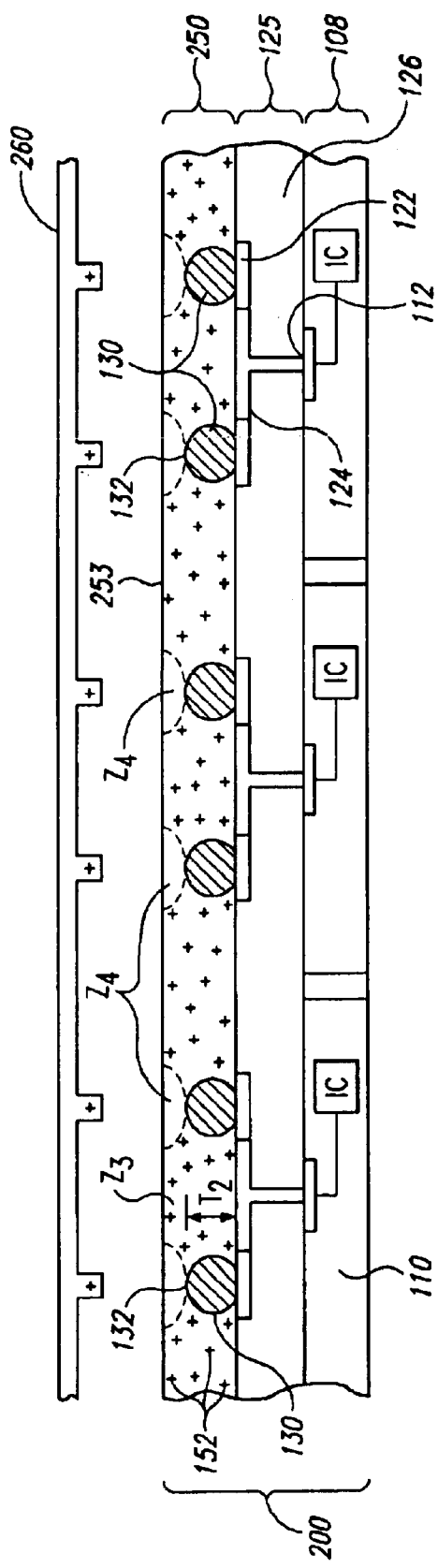
FIG. 4B is a schematic side cross-sectional view of a plurality of microelectronic devices after moving at least some of the electrically charged filler elements within an underfill layer in accordance with another embodiment of the invention.

FIG. 4B is a schematic side cross-sectional view of a plurality of microelectronic devices 200 after moving at least some of the electrically charged filler elements 152 within an underfill layer 250 in accordance with another embodiment of the invention. In this embodiment, a plurality of electric field sources 260 generate discrete electric fields to repel the electrically charged filler elements 152 from a plurality of second zones $Z_4$ to a first zone $Z_3$. The second zones $Z_4$ can be generally hemispherical and can include the portion of the underfill layer 250 between a surface 253 of the underfill layer 250 and the distal ends 132 of the electrical couplers 130. The first zone $Z_3$ includes the portion of the underfill layer 250 outside the second zones $Z_4$. After the electrically charged filler elements 152 have moved from the second zones $Z_4$, the underfill layer 250 can be partially cured to prevent the electrically charged filler elements 152 from moving back into the second zones $Z_4$. Furthermore, as described above with reference to FIG. 4A, the microelectronic devices 200 can be back ground and singulated.

Figure 5:
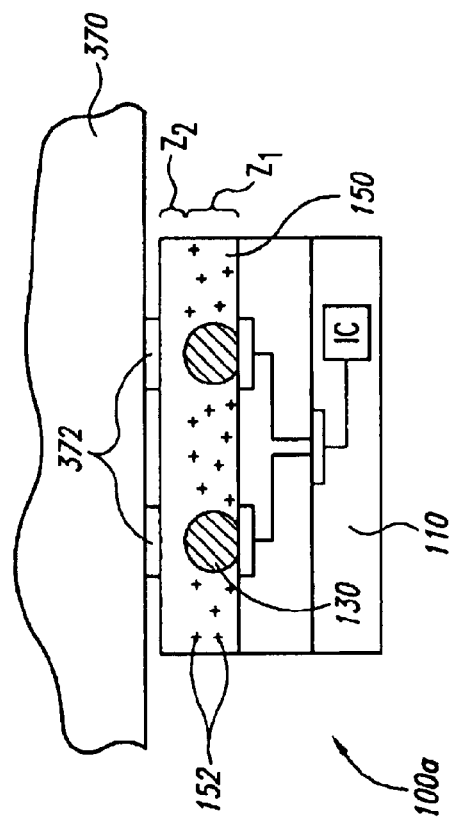

FIG. 5 is a schematic side cross-sectional view of the microelectronic device 100a of FIG. 4A after singulation. The singulated microelectronic device 100a can be attached to a substrate 370, such as a printed circuit board. The substrate 370 includes a plurality of contacts 372 aligned with the electrical couplers 130 of the microelectronic device 100a. To attach the substrate 370 to the microelectronic device 100a, the contacts 372 are pressed into the second zone $Z_2$ of the underfill layer 150. As discussed above, the second zone $Z_2$ of the underfill layer 150 does not include electrically charged filler elements 152, and thus the filler elements 152 do not interfere with the connection between the electrical couplers 130 and the contacts 372.

FIG. 6 is a schematic side cross-sectional view of a microelectronic device assembly 480 including the microelectronic device 100a attached to the substrate 370. After the contacts 372 of the substrate 370 are positioned against the electrical couplers 130, the microelectronic device assembly 480 can pass through the reflow process to melt the solder balls 130 and to securely join the ball-pads 122 to the contacts 372. Furthermore, the underfill layer 150 can be fully cured.

One advantage of the method illustrated in FIGS. 3–6 is that a fillet 454 is created in the underfill 150 and 250 that increases the rigidity of the microelectronic device assembly 480. More specifically, as the contacts 372 are pressed into the underfill 150 and 250, a portion of the underfill 150 and 250 is forced outward, creating the fillet 454 between the substrate 370 and the microelectronic device 100.

Another advantage of the microelectronic device assembly 480 is the improved electrical connection and mechanical bond between the contacts 372 and the electrical couplers 130. In the prior art, before the substrate was attached to the microelectronic device, the portion of the underfill between the contacts of the substrate and the electrical couplers of the microelectronic device included filler particles. When the substrate was attached to the microelectronic device these filler particles sometimes were trapped between the contacts and the electrical couplers. Consequently, these filler particles degraded the electrical conductivity and the mechanical integrity of the connection. In the method illustrated in FIGS. 3–6, the filler elements 152 are moved out of the portion of the underfill layer 150 and 250 between the contacts 372 and the electrical couplers 130 before attachment to prevent the filler elements 152 from becoming trapped between the contacts 372 and the electrical couplers 130. Accordingly, the microelectronic device assembly 480 has an improved electrical connection and mechanical bond between the substrate 370 and the microelectronic device 100a. Furthermore, with the method illustrated in FIGS. 3–6, it is not necessary to remove a top layer of the underfill layer 150 and 250 and expose the electrical couplers 130 in order to achieve the improved connection between the contacts 372 and the electrical couplers 130. Accordingly, the elimination of this planarizing step reduces the mechanical stress on the electrical couplers 130 and the contamination of the underfill layer 150 and 250.

FIG. 7 is a schematic side cross-sectional view of a microelectronic workpiece having a plurality of microelectronic devices 500 in accordance with another embodiment of the invention. The microelectronic devices 500 can be similar to the microelectronic devices 100 discussed above with reference to FIG. 3. For example, the microelectronic devices 500 include an underfill layer 550 having a first zone $Z_1$, a second zone $Z_2$, and a plurality of electrically charged filler elements 152. In the illustrated embodiment, an electric field source 560 attracts the electrically charged filler elements 152 to move them into the second zone $Z_2$ of the underfill layer 550. Next, the underfill layer 550 can be at least partially cured, and the second zone $Z_2$ of the underfill layer 550 can be removed from the microelectronic devices 500 by planarization or another suitable method. After the second zone $Z_2$ of the underfill layer 550 is removed, the microelectronic devices 500 can be diced and attached to substrates without filler elements 152 interfering with the connection between the contacts on the substrate and the electrical couplers 130.

Figure 8:
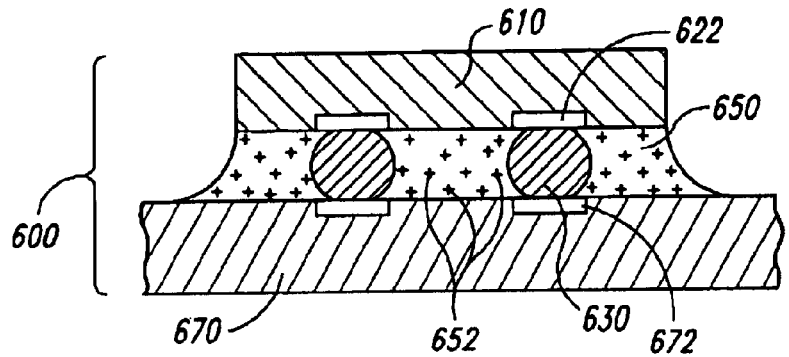
FIGS. 8–10 illustrate various microelectronic device assemblies in accordance with additional embodiments of the invention.
Figure 9:
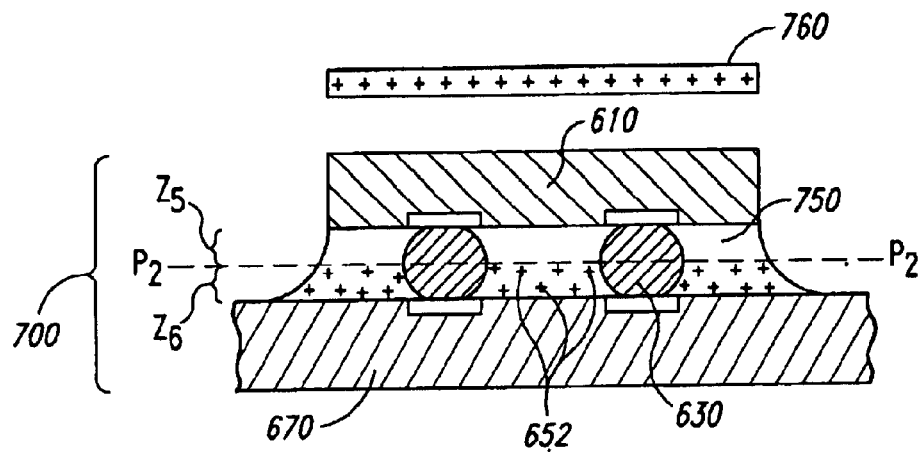
Figure 10:
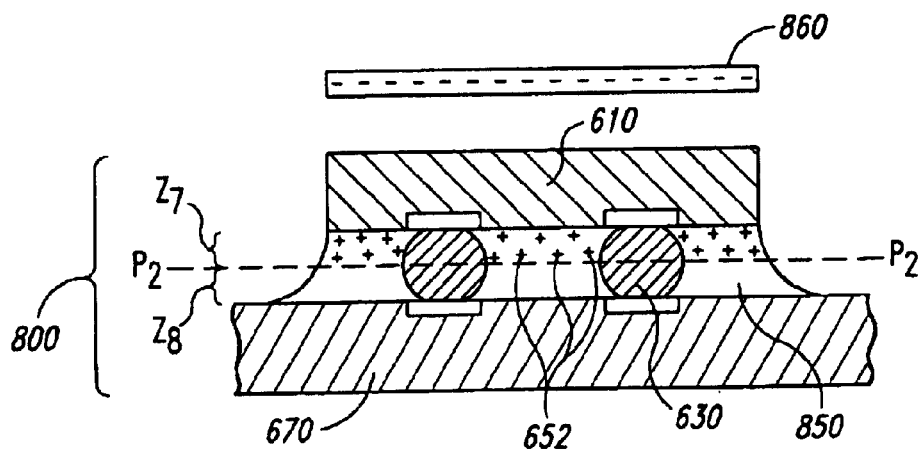

FIGS. 8–10 illustrate various microelectronic device assemblies in accordance with additional embodiments of the invention. FIG. 8 is a schematic side cross-sectional view of a microelectronic device assembly 600 including a microelectronic component 610 and a substrate 670 coupled to the microelectronic component 610. The microelectronic component 610 includes a plurality of ball-pads 622 coupled to corresponding contacts 672 on the substrate 670 by electrical couplers 630.

Figure 1:
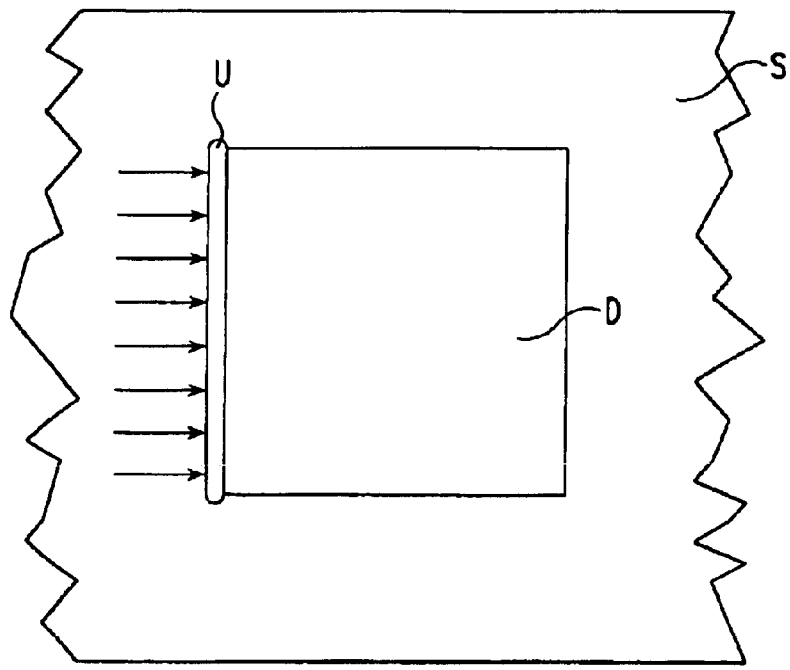
FIG. 1 is a schematic illustration of a prior art underfill process.
Figure 2:
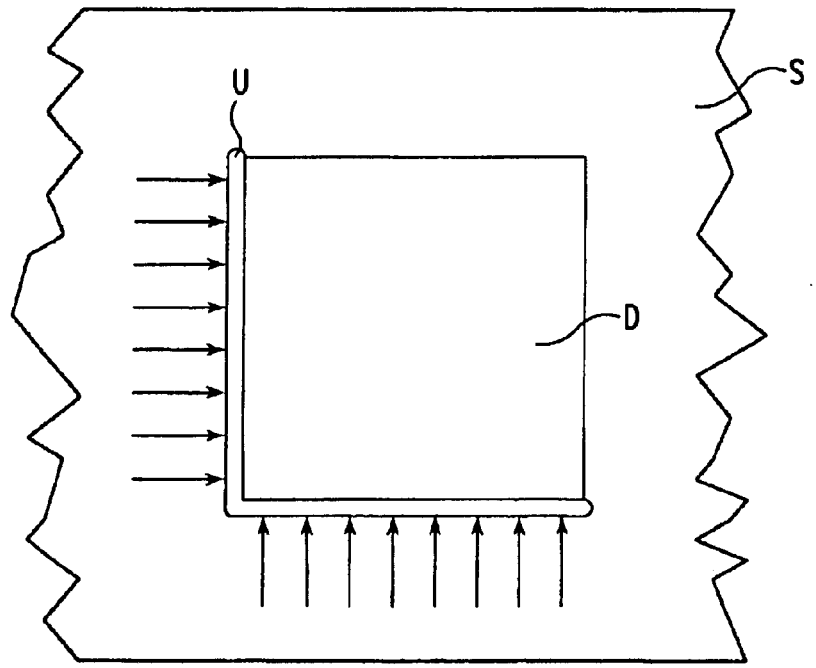
FIG. 2 is a schematic illustration of another prior art underfill process.

The microelectronic device assembly 600 also includes an underfill layer 650 having a plurality of electrically charged filler elements 652. The underfill layer 650 can be applied to the microelectronic device assembly 600 by dispensing a bead of underfill material along one side of the microelectronic component 610. The underfill material will then be drawn into the gap between the microelectronic component 610 and the substrate 670 by capillary action, as described above with reference to FIGS. 1 and 2. Alternatively, the underfill layer 650 can be applied to the microelectronic device assembly 600 by the method described above with reference to FIGS. 3–6. In one aspect of the illustrated embodiment, the electrically charged filler elements 652 have the same charge and consequently repel each other. Accordingly, the electrically charged filler elements 652 disperse throughout the underfill layer 650, creating a generally uniform distribution of the elements 652. The generally uniform distribution of electrically charged filler elements 652 provides a generally uniform coefficient of thermal expansion across the microelectronic device assembly 600.

FIG. 9 is a schematic cross-sectional side view of a microelectronic device assembly 700 in accordance with another embodiment of the invention. The microelectronic device assembly 700 is generally similar to the microelectronic device assembly 600 described above with reference to FIG. 8. For example, the microelectronic device assembly 700 includes a microelectronic component 610, a substrate 670 coupled to the microelectronic component 610, and an underfill layer 750 having a plurality of electrically charged filler elements 652 disposed between the microelectronic component 610 and the substrate 670. In one aspect of the illustrated embodiment, a plane $P_2$ generally equidistant from the microelectronic component 610 and the substrate 670 divides the underfill layer 750 into a first zone $Z_5$ and a second zone $_6$. In other embodiments, the plane $P_2$ may not be equidistant from the microelectronic component 610 and the substrate 670. In the illustrated embodiment, an electric field source 760 repels the electrically charged filler elements 652, and consequently moves the filler elements 652 into the second zone $Z_6$. The greater concentration of the electrically charged filler elements 652 in the second zone $Z_6$ reduces the coefficient of thermal expansion of the second zone $Z_6$. Accordingly, the coefficient of thermal expansion of the second zone $Z_6$ s less than the coefficient of thermal expansion of the first zone $Z_5$.

FIG. 10 is a schematic side cross-sectional view of a microelectronic device assembly 800 in accordance with another embodiment of the invention. The microelectronic device assembly 800 is generally similar to the microelectronic device assembly 600 described above with reference to FIG. 8. For example, the microelectronic device assembly 800 includes a microelectronic component 610, a substrate 670 coupled to the microelectronic component 610, and an underfill layer 850 having a plurality of electrically charged filler elements 652 disposed between the microelectronic component 610 and the substrate 670. In one aspect of the illustrated embodiment, the electric field source 860 attracts the electrically charged filler elements 652 and consequently moves the filler elements 652 into a first zone $Z_7$. The greater concentration of the electrically charged filler elements 652 in the first zone $Z_7$ reduces the coefficient of thermal expansion of the first zone $Z_7$. Accordingly, the coefficient of thermal expansion of the first zone $Z_7$ is less than the coefficient of thermal expansion of a second zone $Z_8$.

From the foregoing, it will be appreciated that specific embodiments of the invention have been described herein for purposes of illustration, but that various modifications may be made without deviating from the spirit and scope of the invention. Accordingly, the invention is not limited except as by the appended claims.

We claim:

1. A microelectronic device, comprising:
   a microelectronic component having an integrated circuit and bond-pads coupled to the integrated circuit;
   a plurality of electrical couplers coupled to the bond-pads of the microelectronic component; and
   an underfill layer covering at least a portion of the plurality of electrical couplers, wherein the underfill comprises a binder and a plurality of electrically charged filler elements in the binder.

2. The microelectronic device of claim 1 wherein the electrically charged filler elements comprise silica.

3. The microelectronic device of claim 1 wherein the underfill layer includes a first zone having a first concentration of electrically charged filler elements and a second zone having a second concentration of electrically charged filler elements different than the first concentration.

4. The microelectronic device of claim 1 wherein the underfill layer includes a first zone having a first concentration of electrically charged filler elements and a second zone having a second concentration of electrically charged filler elements different than the first concentration, and wherein the binder is at least partially cured binder.

5. The microelectronic device of claim 1 wherein the electrical couplers include a proximal end proximate to the microelectronic component and a distal end opposite the proximal end, wherein the distal ends of the electrical couplers define a plane that divides the underfill layer into a first zone between the plane and the microelectronic component and a second zone opposite the first zone, and wherein the first zone has a first concentration of electrically charged filler elements and the second zone has a second concentration of electrically charged filler elements less than the first concentration.

6. The microelectronic device of claim 1 wherein the electrical couplers include a proximal end proximate to the microelectronic component and a distal end opposite the proximal end, wherein the distal ends of the electrical couplers define a plane that divides the underfill layer into a first zone between the plane and the microelectronic component and a second zone opposite the first zone, and wherein the first zone has a first concentration of electrically charged filler elements and the second zone has a second concentration of electrically charged filler elements greater than the first concentration.

7. The microelectronic device of claim 1 wherein the electrical couplers include a proximal end proximate to the microelectronic component and a distal end opposite the proximal end, wherein underfill layer further includes a first surface proximate to the microelectronic component, a second surface opposite the first surface, a first zone having a first concentration of electrically charged filler elements, and a second zone having a second concentration of electrically charged filler elements less than the first concentration, wherein the second zone is generally hemispherical and extends between the second surface and the distal end of one of the electrical couplers.

8. The microelectronic device of claim 1 wherein the electrical couplers comprise solder balls electrically coupled to the microelectronic component.

9. The microelectronic device of claim 1 wherein the microelectronic component comprises a microelectronic die.

10. A microelectronic workpiece, comprising:
a plurality of microelectronic components;
a plurality of electrical couplers arranged in discrete arrays that are electrically coupled to corresponding microelectronic components; and
an underfill layer over at least a portion of the plurality of electrical couplers, wherein the underfill layer comprises a binder and a plurality of electrically charged filler elements in the binder, and wherein the underfill layer includes a first zone having a first concentration of the electrically charged filler elements and a second zone having a second concentration of electrically charged filler elements different than the first concentration.

11. The microelectronic workpiece of claim 10 wherein the electrically charged filler elements comprise silica.

12. The microelectronic workpiece of claim 10 wherein the binder is at least partially cured.

13. The microelectronic workpiece of claim 10 wherein the electrical couplers include a proximal end proximate to the microelectronic component and a distal end opposite the proximal end, wherein the distal ends of the electrical couplers define a plane that divides the underfill layer into the first zone between the plane and the microelectronic component and the second zone opposite the first zone, and wherein the first concentration of electrically charged filler elements is less than the second concentration of electrically charged filler elements.

14. The microelectronic workpiece of claim 10 wherein the electrical couplers include a proximal end proximate to the microelectronic component and a distal end opposite the proximal end, wherein the distal ends of the electrical couplers define a plane that divides the underfill layer into the first zone between the plane and the microelectronic component and the second zone opposite the first zone, and wherein the first concentration of electrically charged filler elements is greater than the second concentration of electrically charged filler elements.

15. The microelectronic workpiece of claim 10 wherein the electrical couplers include a proximal end proximate to the microelectronic component and a distal end opposite the proximal end, wherein underfill layer further includes a first surface proximate to the microelectronic component and a second surface opposite the first surface, and wherein the second zone is generally hemispherical and extends between the second surface and the distal end of one of the electrical couplers.

16. The microelectronic workpiece of claim 10 wherein the microelectronic components comprise microelectronic dies.

17. A microelectronic device assembly, comprising:
a microelectronic component having an integrated circuit and bond-pads coupled to the integrated circuit;
a plurality of electrical couplers coupled to the bond-pads of the microelectronic component;
a substrate having contacts that are coupled to corresponding electrical couplers; and
an underfill layer between the microelectronic component and the substrate, wherein the underfill comprises a binder and a plurality of electrically charged filler elements in the binder.

18. The assembly of claim 17 wherein the electrically charged filler elements comprise silica.

19. The assembly of claim 17 wherein the electrically charged filler elements are distributed generally uniformly throughout the underfill layer.

20. The assembly of claim 17 wherein the underfill layer includes a first zone having a first concentration of electrically charged filler elements and a second zone having a second concentration of electrically charged filler elements different than the first concentration.

21. The assembly of claim 17 wherein a plane divides the underfill layer into a first zone having a first concentration of electrically charged filler elements and a second zone having a second concentration of electrically charged filler elements less than the first concentration, wherein the plane is generally parallel to the microelectronic component and is between the microelectronic component and the substrate, and wherein the first zone includes the portion of the underfill layer between the plane and the microelectronic component and the second zone includes the portion of the underfill layer between the plane and the substrate.

22. The assembly of claim 17 wherein a plane divides the underfill layer into a first zone having a first concentration of electrically charged filler elements and a second zone having a second concentration of electrically charged filler elements greater than the first concentration, wherein the plane is generally parallel to the microelectronic component and is between the microelectronic component and the substrate, and wherein the first zone includes the portion of the underfill layer between the plane and the microelectronic component and the second zone includes the portion of the underfill layer between the plane and the substrate.

23. The assembly of claim 17 wherein a plane divides the underfill layer into a first zone having a first coefficient of thermal expansion and a second zone having a second coefficient of thermal expansion greater than the first coefficient, wherein the plane is generally parallel to the microelectronic component and is between the microelectronic component and the substrate, and wherein the first zone includes the portion of the underfill layer between the plane and the microelectronic component and the second zone includes the portion of the underfill layer between the plane and the substrate.

24. The assembly of claim 17 wherein a plane divides the underfill layer into a first zone having a first coefficient of thermal expansion and a second zone having a second coefficient of thermal expansion less than the first coefficient, wherein the plane is generally parallel to the microelectronic component and is between the microelectronic component and the substrate, and wherein the first zone includes the portion of the underfill layer between the plane and the microelectronic component and the second zone includes the portion of the underfill layer between the plane and the substrate.

25. The assembly of claim 17 wherein the electrical couplers comprise solder balls electrically coupled to the microelectronic component.

26. The assembly of claim 17 wherein the microelectronic component comprises a microelectronic die.

27. A microelectronic device assembly, comprising:
a microelectronic component having a plurality of pads;
a plurality of electrical couplers electrically coupled to corresponding pads;
a substrate having contacts that are coupled to corresponding electrical couplers; and
an underfill layer between the microelectronic component and the substrate, wherein the underfill comprises a binder and a plurality of electrically charged filler elements in the binder, and wherein the plurality of electrically charged filler elements are distributed generally uniformly throughout the underfill.

28. The assembly of claim 27 wherein the electrically charged filler elements comprise silica.

29. The assembly of claim 27 wherein the electrical couplers comprise solder balls.

30. The assembly of claim 27 wherein the microelectronic component comprises a microelectronic die.

31. A microelectronic device assembly, comprising:
a microelectronic component having a plurality of pads;
a plurality of electrical couplers electrically coupled to the plurality of pads;
a substrate having contacts that are coupled to the electrical couplers; and
an underfill layer between the microelectronic component and the substrate, wherein the underfill comprises a binder and a plurality of electrically charged filler elements in the binder, and wherein the underfill layer includes a first zone having a first concentration of electrically charged filler elements and a second zone having a second concentration of electrically charged filler elements different than the first concentration.

32. The assembly of claim 31 wherein the electrically charged filler elements comprise silica.

33. The assembly of claim 31 wherein a plane divides the underfill layer into the first zone and the second zone, wherein the plane is generally parallel to the microelectronic component and is between the microelectronic component and the substrate, wherein the first zone includes the portion of the underfill layer between the plane and the microelectronic component and the second zone includes the portion of the underfill layer between the plane and the substrate, and wherein the first concentration of electrically charged filler elements is greater than the second concentration.

34. The assembly of claim 31 wherein a plane divides the underfill layer into the first zone and the second zone, wherein the plane is generally parallel to the microelectronic component and is between the microelectronic component and the substrate, wherein the first zone includes the portion of the underfill layer between the plane and the microelectronic component and the second zone includes the portion of the underfill layer between the plane and the substrate, and wherein the first concentration of electrically charged filler elements is less than the second concentration.

35. The assembly of claim 31 wherein a plane divides the underfill layer into the first zone and the second zone, wherein the plane is generally parallel to the microelectronic component and is between the microelectronic component and the substrate, wherein the first zone includes the portion of the underfill layer between the plane and the microelectronic component and the second zone includes the portion of the underfill layer between the plane and the substrate, and wherein the first zone has a first coefficient of thermal expansion and the second zone has a second coefficient of thermal expansion less than the first coefficient.

36. The assembly of claim 31 wherein a plane divides the underfill layer into the first zone and the second zone, wherein the plane is generally parallel to the microelectronic component and is between the microelectronic component and the substrate, wherein the first zone includes the portion of the underfill layer between the plane and the microelectronic component and the second zone includes the portion of the underfill layer between the plane and the substrate, and wherein the first zone has a first coefficient of thermal expansion and the second zone has a second coefficient of thermal expansion greater than the first coefficient.

37. A composition for use in an underfill layer of a microelectronic device, comprising:
a flowable binder having a first state in which the binder is flowable and a second state with a greater viscosity than the first state; and
a plurality of electrically charged filler elements disposed within the flowable binder.

38. The composition of claim 37 wherein the electrically charged filler elements comprise silica.

39. The composition of claim 37 wherein the electrically charged filler elements comprise silicon nitride.

40. The composition of claim 37 wherein the electrically charged filler elements comprise aluminum oxide.

41. The composition of claim 37 wherein the electrically charged filler elements comprise aluminum nitride.

42. The composition of claim 37 wherein the flowable binder comprises a liquid polymer.

* * * * *

UNITED STATES PATENT AND TRADEMARK OFFICE
CERTIFICATE OF CORRECTION

PATENT NO. : 6,768,209 B1
DATED : July 27, 2004
INVENTOR(S) : Tongbi Jiang et al.

It is certified that error appears in the above-identified patent and that said Letters Patent is hereby corrected as shown below:

Column 1,
Line 12, "underfll" should be -- underfill --;
Line 23, "substrate," should be -- substrate. --;
Line 24, delete comma between "commonly" and "include".

Signed and Sealed this

Sixteenth Day of August, 2005

JON W. DUDAS
*Director of the United States Patent and Trademark Office*